US011387086B2

(12) United States Patent
Perugini et al.

(10) Patent No.: US 11,387,086 B2
(45) Date of Patent: Jul. 12, 2022

(54) MACHINE FOR THE DEPOSITION OF MATERIAL BY THE CATHODIC SPUTTERING TECHNIQUE

(71) Applicant: KENOSISTEC S.R.L., Massa Martana (IT)

(72) Inventors: Stefano Perugini, Massa Martana (IT); Simone Mutti, Massa Martana (IT); Michele Abbiati, Massa Martana (IT)

(73) Assignee: KENOSISTEC S.R.L., Massa Martana (IT)

( * ) Notice: Subject to any disclaimer, the term of this patent is extended or adjusted under 35 U.S.C. 154(b) by 0 days.

(21) Appl. No.: 16/972,055

(22) PCT Filed: Jun. 8, 2018

(86) PCT No.: PCT/IB2018/054152
§ 371 (c)(1),
(2) Date: Dec. 4, 2020

(87) PCT Pub. No.: WO2019/234477
PCT Pub. Date: Dec. 12, 2019

(65) Prior Publication Data
US 2021/0242001 A1  Aug. 5, 2021

(51) Int. Cl.
*H01J 37/34* (2006.01)
*C23C 14/35* (2006.01)

(52) U.S. Cl.
CPC .......... *H01J 37/3455* (2013.01); *C23C 14/35* (2013.01); *H01J 37/3405* (2013.01); *H01J 2237/002* (2013.01)

(58) Field of Classification Search
CPC .... H01J 37/3405; H01J 37/342; H01J 37/345; H01J 37/3452; H01J 37/3455; H01J 37/347; H01J 37/3497; C23C 14/35
(Continued)

(56) References Cited

U.S. PATENT DOCUMENTS 4,904,362 A * 2/1990 Gaertner ................. C23C 14/16
                                                          204/192.12
6,436,252 B1   8/2002 Tzatzov et al.
(Continued)

FOREIGN PATENT DOCUMENTS

EP      3336217 A1    6/2018
JP      59-197570  * 11/1984
WO   2011033268 A1    3/2011

OTHER PUBLICATIONS

International Search Report and Written Opinion for Corresponding International Application No. PCT/IB2018/054152 (14 Pages) ( dated Feb. 1, 2019).

*Primary Examiner* — Rodney G McDonald
(74) *Attorney, Agent, or Firm* — Lucas & Mercanti, LLP

(57) ABSTRACT

A machine for the deposition of material on a substrate by the cathodic sputtering technique is provided, of the type provided with a cathode assembly having a tubular support extending substantially along a first axis (A), and a plurality of magnetic elements constrained to the tubular support and spaced from one another along the first axis (A), and wherein each of the magnetic elements has at least one second axis (M) of magnetic orientation, linking the respective magnetic poles (N; S) and has an outer side jutting from the tubular support and an inner side constrained to the tubular support, wherein the second axis (M) linking the poles of each magnetic element is transverse to the first axis (A) of the tubular support and the polarity (S; N) of the outer sides of two consecutive magnetic elements along the first axis (A) on the tubular support is alternating.

15 Claims, 5 Drawing Sheets

(58) Field of Classification Search
USPC .................................... 204/298.22, 298.21
See application file for complete search history.

(56) References Cited

U.S. PATENT DOCUMENTS

| | | |
|---|---|---|
| 2006/0076235 A1 | 4/2006 | Wei |
| 2012/0199476 A1* | 8/2012 | Allers ................ H01J 37/3455 |
| | | 204/298.12 |
| 2015/0235817 A1 | 8/2015 | Goto |

* cited by examiner

MACHINE FOR THE DEPOSITION OF MATERIAL BY THE CATHODIC SPUTTERING TECHNIQUE

CROSS-REFERENCE TO RELATED APPLICATIONS

This application is a 371 of PCT/IB2018/054152 filed Jun. 8, 2018.

FIELD OF THE INVENTION

The present invention relates to the field of the machines for the deposition of material by the cathodic sputtering technique.

KNOWN PREVIOUS ART

It is known to implement machines able to carry out the coating of a substrate usually placed in a vacuum chamber, thanks to the deposition, on its surface, of atoms or ions emitted by a solid sacrificial body subjected to the bombardment of high energy particles. In particular, the emission of atoms or ions from the sacrificial body is caused by a plurality of high energy particles, such as for example gas ions in the plasma state, which is caused to hit the sacrificial body, therefore also termed "target".

The target body can be composed of all the elemental materials or their compounds being deposited on the deposition substrate both in their pure and modified state by chemical reactions with the gases that are inside the vacuum chamber.

Such a machine for the deposition of material has a plurality of applications, such as for example those in the industrial field and those in the scientific research field. In the industrial field, such machines can be used for surface coatings of pieces of different geometries and sizes. For example in the semiconductor industry, such a machine can be used for depositing thin layers of material, such as tungsten, aluminium, titanium, copper, etc. Other uses can be those related to the deposition of anti-reflection layers or to surface metalization.

As mentioned, a machine for the deposition of material by the cathodic sputtering technique allows the deposition of a coating material on a deposition substrate, placed for example in a low pressure chamber, by means of a process of erosion of the target, or as denoted in the following "target body", consisting of such a coating material. In particular, during the erosion of the target body, the coating material, in the form of atoms, ions, or molecule portions, detaches from the latter and spreads in the surrounding areas, finally adhering on the deposition substrate.

The erosion of the target body can occur thanks to the use of a strongly ionized gas, in the "plasma" state, interposed between said target body and said deposition substrate and suitably excited to provide high energy particles intended for hitting the target body in order to cause the afore said erosion thereof.

Machines for the deposition of material are known and have an electric potential difference (for example of some kV) between the target body and the deposition substrate. Usually, the target body is the cathode (negative pole) whereas the substrate, or another element, is the anode (positive pole).

The moment in which an inert gas, such as for example argon, is filled between said target body and said deposition substrate, in suitable pressure conditions (for example some tens of mTorr), the free electrons in the gas are accelerated away from the cathode negative charge, so that they hit the inert gas atoms and ionize them. In this way, a chain reaction is triggered and a strongly ionized gas, or "plasma", is achieved. The ionized atoms of the inert gas are in this case atoms with positive charge and are thus accelerated by electrostatic attraction towards the cathode, in this case represented by the target body. The ionized atoms collide with the target surface, cause the detachment of coating material (atoms or ions) from the target that, by spreading in a direction opposite to the one taken by the target, is caused to adhere to the deposition substrate.

Machines for the deposition of material are known and further comprise a plurality of magnets (to form a so called "magnetron"), able to generate a magnetostatic field. Such magnets are usually placed under the target body, or however at the latter on the side opposite to that wherein the substrate to be coated is placed, so that the resulting magnetic field interacts with the ionized atoms in the chamber interposed between the target body and the deposition substrate, thus modifying the trajectory of the ionized atoms towards the target body and increasing the probability of collisions with subsequent increase of the number of ionized molecules, in order to have higher process yield.

It has to be observed that by "yield" of the process the "sputtering yield" is usually meant, i.e. the ratio between the number of atoms eroded from the target and the incident ions on the surface of the target body.

In such cathodic sputtering machines comprising magnets (the so-called "magnetron sputtering" process), the latter can be arranged along a tubular support so that to generate magnetic fields with flow lines radial or axial with respect to the axis of the tubular support itself. In some cases, such tubular supports with the respective magnets, in order to allow a given homogeneity in the effect produced by the magnetic fields, can be rotated or translated with respect to the target body.

Such a solution can be implemented for example in case the target body and also possibly the substrate to be coated have cylindrical shape. In this case we talk of machine for the magnetron sputtering of cylindrical type.

U.S. Pat. No. 6,436,252 describes a machine for the deposition of coating material by the cathodic "magnetron" sputtering comprising a plurality of magnets arranged along a tubular support clearly made of a diamagnetic material, which can be translated with respect to the respective target body having cylindrical shape.

The magnets are located on the tubular support so that each magnet generates, with the two closest magnets, two respective magnetic fields with "axial" field lines, i.e. substantially arranged on planes passing through the support axis. It has thus to be observed that the axis linking the north and south poles of each magnet, i.e. the axis of magnetic orientation, is arranged along a direction parallel to the axis of the cylindrical support.

However, known machines for the deposition of material have some drawbacks.

A drawback is the low yield of the process, i.e. the low rate between the number of atoms eroded from the target and the ions hitting the surface of the target body, thus causing an increase of times and costs of the process.

Another drawback is the uneven erosion of the target body. Such a problem does not allow the process of deposition of material to be optimized, since known machines produce an amount of scraps of material of the target elements when the latter are unevenly eroded.

An additional drawback is the difficulty in fitting the machine sizes as a function of the deposition substrate or other parameters of the deposition process. In particular, in case the sizes of the target body and substrate to be coated have to be increased, designing a new machine or however a high number of components thereof is usually required, in order to fit the process to the new needs in terms of sizes.

Object of the present invention is to provide a machine for the deposition of material able to increase the yield of the sputtering process.

Additional object of the present invention is to make the process of erosion of the target body as even as possible. In this way, object of the present invention is to reduce the scraps during the process of deposition of material, increase the effectiveness of the process and reduce the costs.

Additional object of the present invention is to provide a machine for the deposition of material able to easily fit its own sizes based on the deposition substrate sizes.

Additional object of the present invention is to obtain high deposition rate in order to avoid possible chemical reactions due to the exposure time of the deposition itself required for obtaining the desired thicknesses.

SUMMARY OF THE INVENTION

These and other objects are achieved by the present invention by means of a machine for the deposition of material according to the main claim and the dependent claims.

The machine for the deposition of material on a substrate according to the present invention is a machine for the cathodic magnetron sputtering, with cylindrical geometry and of the type provided with a cathode assembly comprising:
  a tubular support extending substantially along a first axis and preferably, but not necessarily, at least partially made of a magnetic or ferromagnetic or even paramagnetic, but however not diamagnetic, material;
  a plurality of magnetic elements constrained to the tubular support spaced from one another along at least said first axis or along at least one direction parallel to said first axis, and wherein each of the magnetic elements is provided with an outer side jutting from the tubular support and with an inner side facing the axis of such a tubular support (and which for example can be constrained to the tubular support itself), and has at least one second axis of magnetic orientation linking the respective magnetic poles;
  at least one target body having substantially cylindrical shape and being arranged spaced around the cylindrical support with the plurality of magnetic elements and comprising the material to be deposited on the substrate, the outer side of each magnetic element facing at least one target body;
  and finally movement means for the relative movement between the tubular support, with the plurality of magnetic elements, and the target body.

Advantageously, the afore said at least one second axis linking the poles of each magnetic element is transverse, and preferably radial, to the first axis of the tubular support, the outer side of each magnetic element has the same polarity along its entire extent, and furthermore the polarity of the outer sides of two consecutive magnetic elements, along at least said first axis or along at least one direction parallel to said first axis, on the tubular support is alternating.

According to an aspect of the present invention, each of the magnetic elements has annular or discoid section with symmetry axis substantially parallel to the afore said first axis of the tubular support and with the second axis of magnetic orientation substantially radial and orthogonal to such a first axis of the tubular support.

Advantageously, the machine according to the invention allows the yield of the sputtering process to be increased. More specifically, the presence of magnetic elements and the orientation of the axis linking the poles of each magnetic element with respect of the tubular support of the machine allow the plasma ions to be effectively accelerated towards the target body, thus increasing the yield of the process. Another advantage of the present invention consists in arranging the movement means for the relative movement between the tubular support, to which the magnetic elements are usually integral, and the target body. The movement means thus allow monitoring the erosion area of the target body and making it as even as possible.

According to another aspect of the present invention, each magnetic element comprises a plurality of magnets having radial axis of magnetic orientation. In other words each magnetic element, preferably having annular or discoid section shape, consists of a plurality of magnets with the same radial magnetic orientation and closed side by side. Advantageously, the geometry of the machine according to the invention can be easily fitted to the desired sizes, for example depending on the need of depositing material on a substrate of desired sizes, by simply increasing or decreasing the sizes of the tubular support and adding or removing magnets to and from the plurality of magnets composing each magnetic element. The advantage of easily fitting the machine sizes on different needs allows machines for the deposition of material of different sizes and geometries to be provided by modifying as low as possible the number of components, thus increasing the versatility of the machine construction design and reducing the production costs.

In a preferred embodiment of the present invention, each of the magnetic elements is arranged along a helicoid line on the outer surface of the tubular support, so that the outer sides of such magnetic elements, at least along directions substantially parallel to the afore said first axis along which the tubular support extends, have alternating polarity.

According to an additional aspect of the present invention, the machine for the deposition of material comprises cooling means for cooling at least said target body.

Advantageously, the cooling means of the target body allow the yield of the process to be increased since the process has not to be interrupted in order for the target body itself to be cooled.

Furthermore, the energy required for obtaining this high deposition rate is dissipated thanks to a high flow of cooling liquid allowed by the invention described below.

BRIEF DESCRIPTION OF THE FIGURES

Further characteristics and advantages of the present invention will be more evident from the following description, made by way of example, with reference to the accompanying figures in which.

DETAILED DESCRIPTION OF A PREFERRED EMBODIMENT OF THE PRESENT INVENTION

Figure 1:
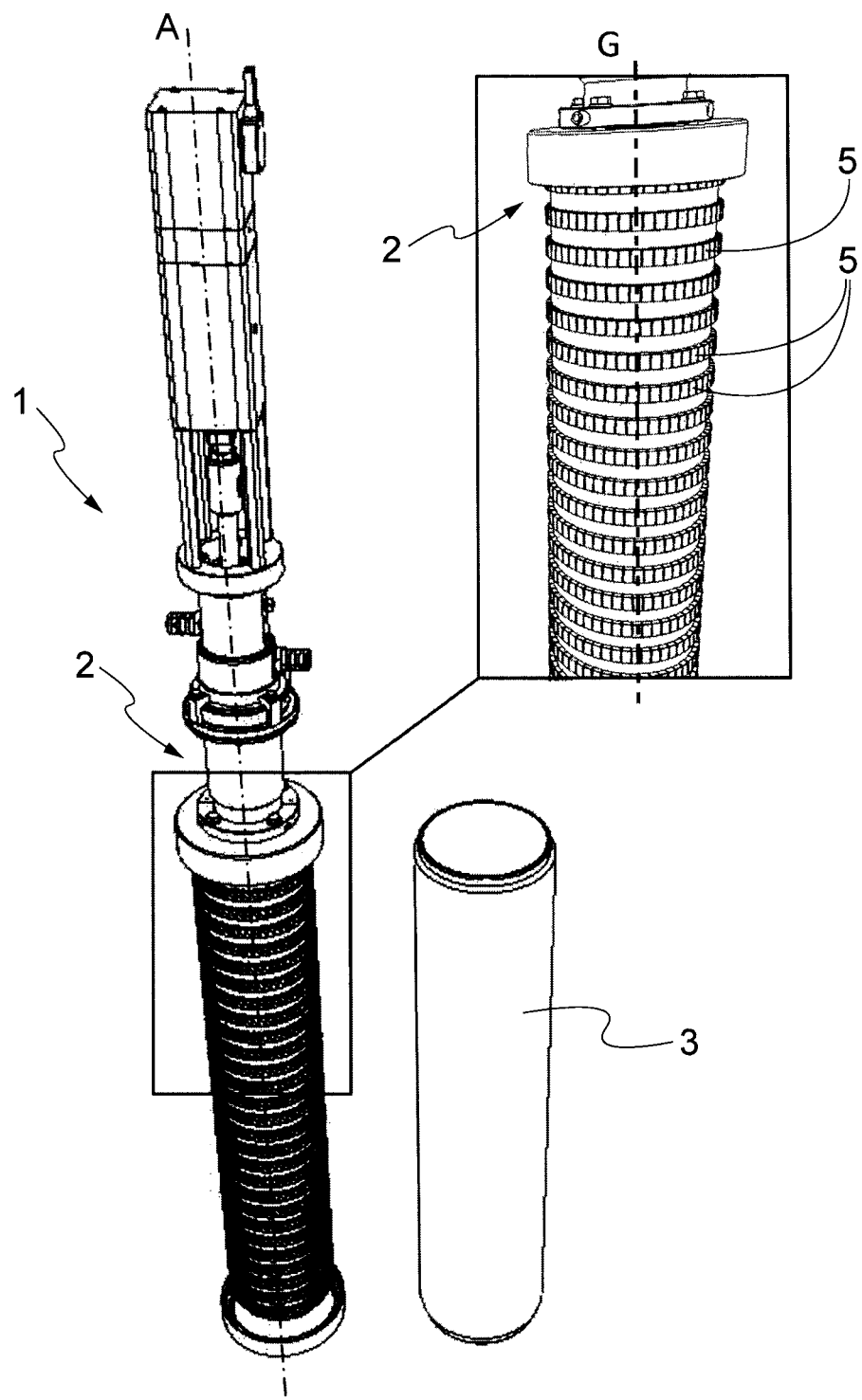
FIG. 1 shows a perspective view of part of the cathode assembly of the machine for the deposition of material according to the present invention, in a configuration wherein the target body is not coaxially assembled to the respective tubular support for magnets.
Figure 2:
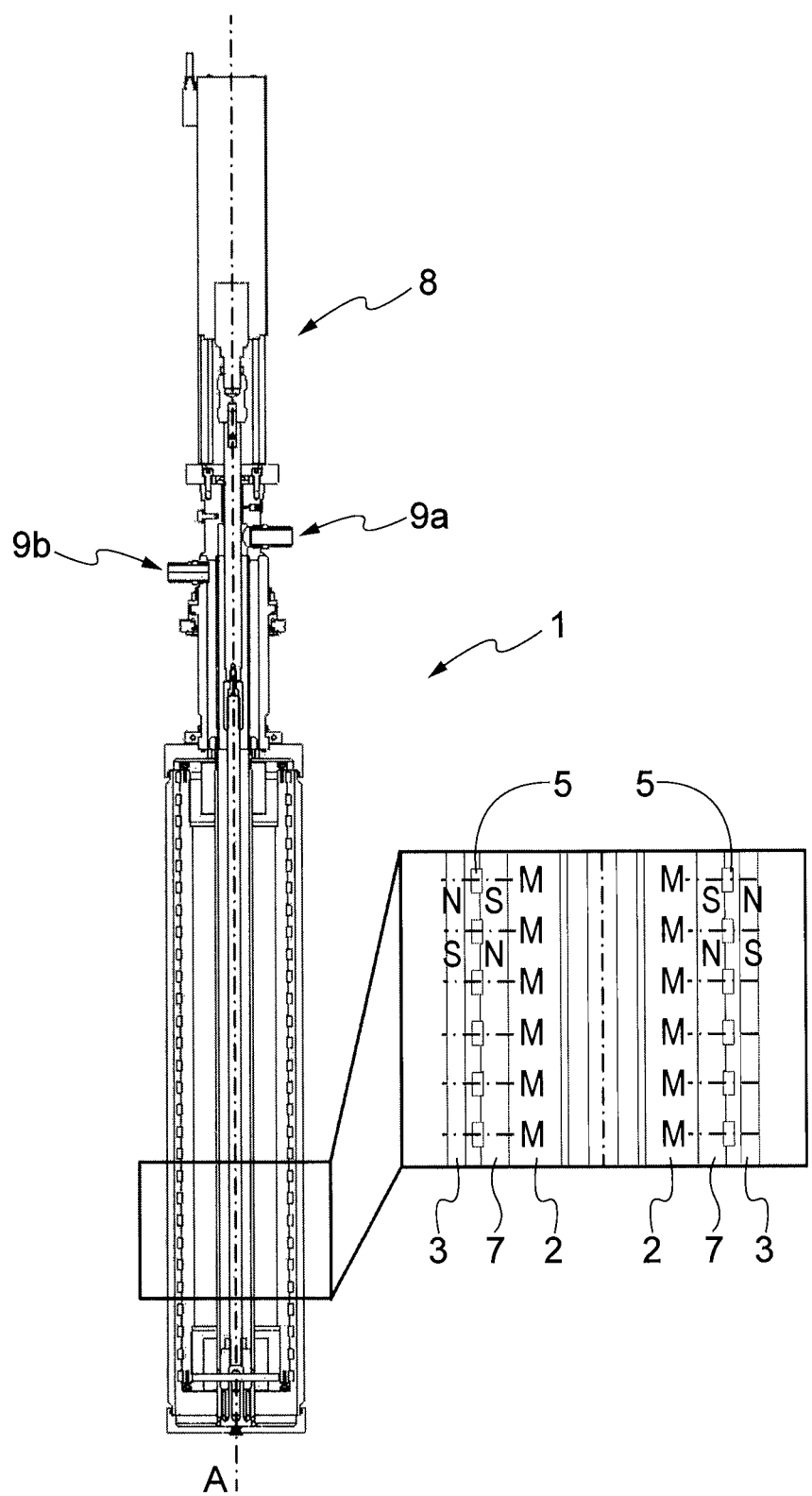
FIG. 2 shows a sectional view of part of the cathode assembly of the machine for the deposition of material according to the present invention.
Figure 3:
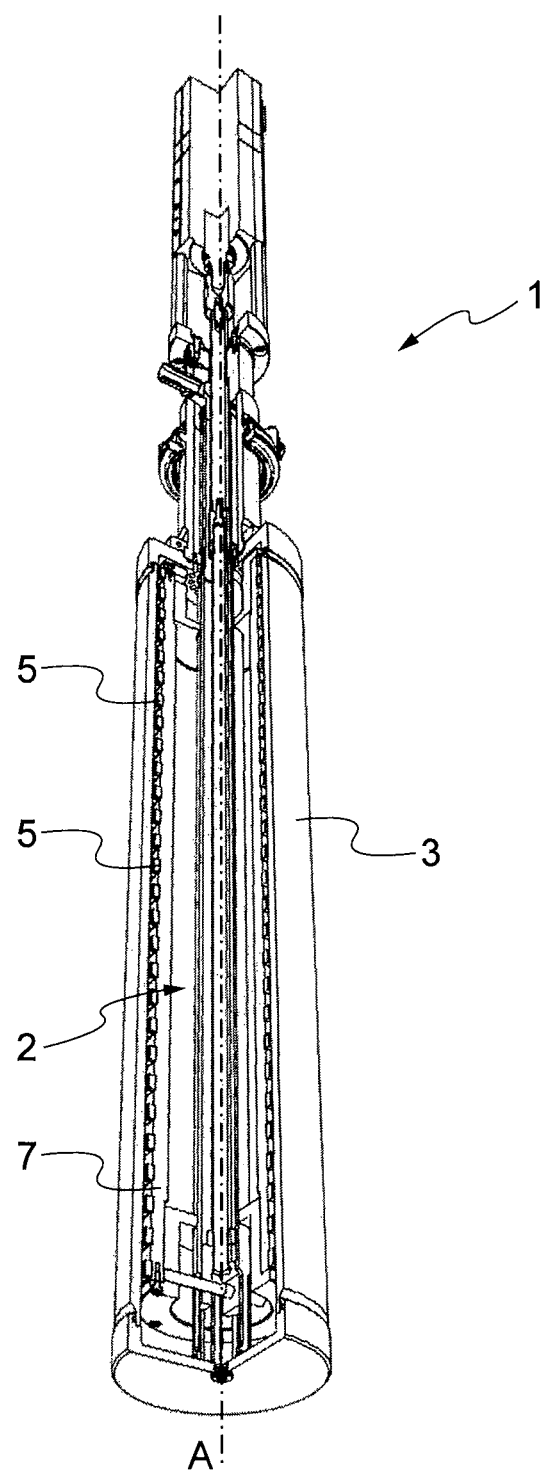
FIG. 3 shows a three-dimensional cut-away view of a detail of the cathode assembly of the machine for the deposition of material according to the present invention.

In reference in general to FIGS. 1-3, the machine 1 for the deposition of material on a substrate by the cathodic magnetron sputtering technique, according to the present invention, has a basic structure, or cathode assembly, comprising a tubular support 2 extending substantially along a first axis A and on which, as it will be seen, a plurality of magnetic elements 5 is arranged in order to constitute magnetostatic fields, and at least one target body 3 preferably of a metallic material, which can have a substantially cylindrical shape and is arranged spaced around the tubular support 2. The tubular support 2 can further be at least translated with respect to the target body 3, or vice versa.

The target body 3 is the element of the machine 1 and is made of, or however comprises, the material that during the sputtering process is deposited on a substrate to be coated (not shown in figures) and subjected to a potential difference with respect to such a substrate to be coated.

More specifically, in the embodiment shown in FIGS. 1-3, the machine 1 is a machine for the deposition of material according to the cathodic magnetron sputtering technique, which comprises a cathode assembly placed inside a low pressure chamber (or vacuum chamber) and a substrate to be coated, wherein the cathode consists of the afore said target body 3, whereas the anode consists of the substrate to be coated, and wherein there is a tubular support 2 arranged at such a target body 3 and comprising a plurality of magnetic elements 5 able to define a suitable magnetostatic field.

The substrate to be coated, on which the material of the target body 3 is deposited, is arranged in front of the target body 3 itself and is spaced with respect to the same, in addition to be subjected to a potential difference (for example of some kV) with respect to such a target body 3, so that the latter is a cathode and the substrate to be coated is a respective anode.

As known, the substrate on which the material is deposited can be an industrial piece or a plurality of pieces arranged side by side during the sputtering process according to the present invention. According to a possible embodiment, the substrate can be a tubular piece arranged around the target body 3. According to another embodiment, the substrate can have any geometrical shape and have one or more surfaces arranged as spaced with respect to the hollow body 3.

It should be observed that in FIG. 1, the target body 3 has been purposely drawn side by side with respect to the tubular support 2 of the machine 1, in order to better allow the pieces composing the tubular support 2 to be displayed.

The position of the target body 3 during the process of cathodic sputtering is the one shown in FIGS. 2 and 3, i.e. around the tubular support 2 and spaced with respect to the same.

In the same way, it should be observed that in the herein shown figures the low pressure (or vacuum) chamber has not been shown inside which the cathode assembly herein shown, the support to be surface coated and the inert gas are each arranged, the latter, being in the plasma state and whose ions are accelerated by magnetic fields of the magnetic elements 5 arranged on the support 2, allows the sputtering of the target body 3.

Between the target body 3 and the substrate, inside the low pressure chamber, a volume suitable for the insertion of a fluid (for example an inert gas such as argon) that can be ionized thanks to the ionization actuated by the cathode assembly comprising the target body 3, is obtained. The such ionized fluid, placed at suitable pressure conditions (for example some tens of mTorr), forms the plasma that, during the sputtering process and thanks to the presence of high energy ions hitting the target body 3 itself, erodes the surface of such a target body 3.

The machine 1 for the deposition of material on a substrate according to the present invention, as mentioned, is a machine able to implement the magnetron sputtering technique, and thus comprises magnetic elements 5 on a respective tubular support 2, which are able to generate static magnetic fields with the aim of increasing the yield of the deposition of material or the yield of the sputtering process.

More specifically, in the machine 1 object of this invention, such a tubular support 2 develops substantially along a preferably straight axis A and comprises at least one pair of magnetic elements 5 constrained thereto and able to generate a static magnetic field. The magnetic field generated by the magnets 5 allows the acceleration of the electrically charged ions of the plasma contained between the target body 3 and the substrate to be coated.

The machine 1 further comprises movement means 8 for the translationally movement, at least and preferably only, of such a tubular support 2 with respect to the target body 3 or vice versa.

It has to be observed that herein and in the following by "tubular support 2" a structural component of the machine 1 is meant, consists of one or more parts and has elongated shape, i.e. with a prevailing dimension (i.e. that of the axis A) with respect to the other two, and has the function of supporting the magnetic elements 5 responsible for creating the magnetostatic field able to properly accelerate the plasma ions directed towards the target body 3.

In a preferred embodiment, the tubular support 2 has a generally cylindrical shape, i.e. it is a body having its own outer surface obtained by drawing, through the single points of a given closed line called directrix lying on a plane (for example a given radius circle), the perpendiculars to the plane of such a directrix, called generatrices.

Furthermore, the arrangement of the magnetic elements 5 on such a tubular support 2 is such that the yield of the sputtering process is optimum, since the erosion of the surface of the target body 3 is increased due to the acceleration imparted to the plasma ions. Specifically, the ions are accelerated in the direction of the target body 3 by means of the Lorentz force, i.e. due to the electro-magnetic interaction among the electrically charged plasma ions and the magnetic field generated by such magnetic elements 5.

The magnetic elements 5 are constrained to the tubular support 2 spaced from one another at least along the axis A of such a tubular support 2 or in general along at least one direction substantially parallel to such an axis A. Specifically, each magnetic element 5 is arranged spaced with respect to another magnetic element 5, so that the magnetic field lines determine a substantially arched geometry between a magnetic element 5 and another subsequent and adjacent magnetic element 5 thanks to the fact that, as it will be seen, the polarities of the outer sides of two adjacent magnetic elements in the direction of the axis A of the tubular support 2 are alternating one another along such an axis A and/or at least along directions parallel to such an axis A.

The magnetic orientation of each magnetic element 5 is defined by at least one axis M of magnetic orientation linking the magnetic poles N, S of each magnetic element. Furthermore, each magnetic element has two opposing sides, a first inner side preferably constrained to the tubular support 2, and a second outer side jutting towards the target body 3 from the same tubular support 2.

It has to be observed that, according to an additional embodiment not shown in the accompanying figures, each magnetic element 5 can be constrained to the tubular support 2 in a point not belonging to the first side of said two above described opposing sides. In other words, a magnetic element 5 can be constrained to the tubular support 2 in a point comprised between said two opposing sides.

In any case, each magnetic element 5 has an outer side facing the target body 3 and an inner side facing the axis A of the tubular support 2.

In this way, in case of tubular support 2 having cylindrical geometry, preferably with circular base (directrix), each magnetic element 5 can take for example such a shape to have an annular section with symmetry axis passing through the axis A of the tubular support 2 itself.

Figure 4:
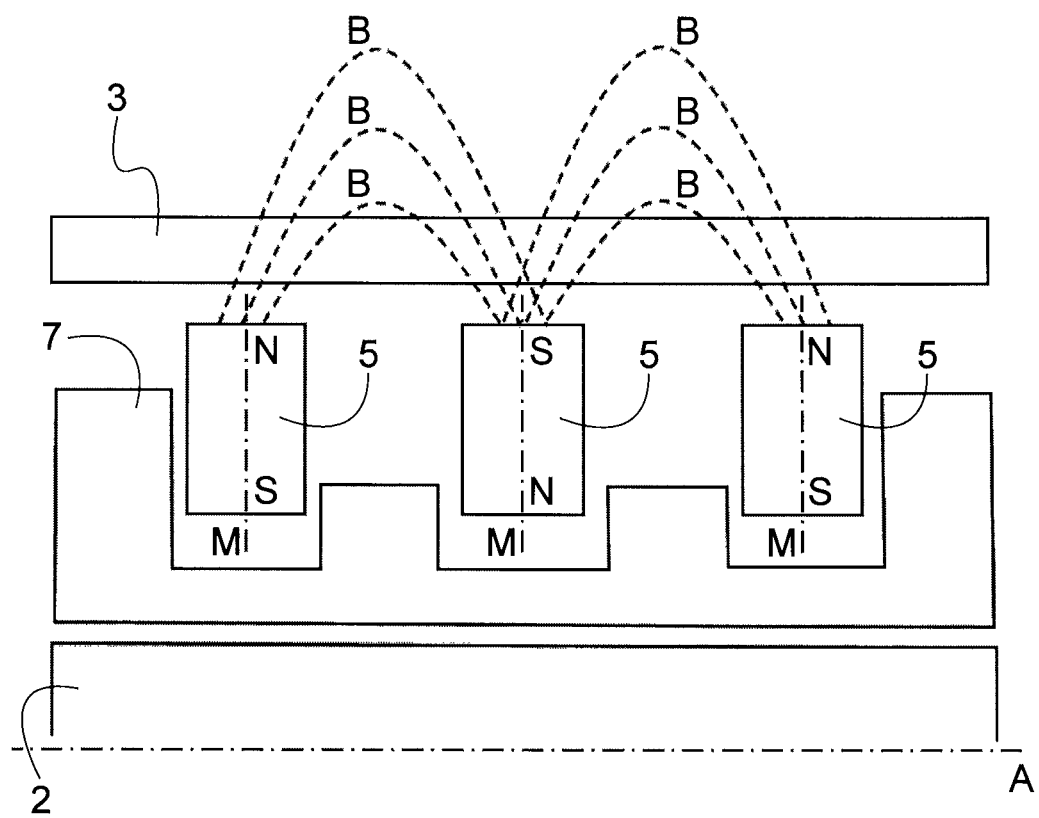
FIG. 4 shows a representative layout of the cathode assembly of the machine for the deposition of material according to the present invention.

Advantageously according to the present invention, as also shown in the layout of FIG. 4 depicting a section of a half of the tubular support 2 with the respective magnetic elements 5 and a section of the respective target body 3, each of the magnetic elements 5 constrained to the central core of the supporting element 2 by—in this case and not necessarily—a frame 7, has an outer side having on its entire extent, i.e. on its entire surface facing the target body 3, the same magnetic polarity S or N and an inner side facing the axis A of the tubular support 2 and having on its entire extent the opposite magnetic polarity N or S. Furthermore, each of such magnetic elements 5 is constrained to the support 2 so that the axis, or axes, of magnetic orientation M is always arranged transversely, and preferably radially and perpendicularly, with respect to the axis A of such a tubular support 2, and so that the polarity of the outer sides of two consecutive magnetic elements (5) along the axis A or along at least one direction substantially parallel to such an axis A, is alternating, so as to define the magnetic fields with field lines B visible in the afore said FIG. 4.

Specifically, as it can be seen in the latter figure, the magnetic elements 5 of the machine 1 are arranged on the tubular support 2 so that to be properly spaced from one another and to be oriented so that the polarities of their outer sides are alternating along the axis A of such a tubular support 2.

In other words, the magnetic elements 5 are arranged on the support 2 so that their side facing the target body 3 of two magnetic elements 5 side by side and in succession, has alternating polarity N, S, respectively. For example, if a first magnetic element 5 has such a magnetic orientation that the side facing the target body 3 has N polarity, a second magnetic element 5 placed side by side in succession to said first magnetic element 5 has such a magnetic orientation that the side facing the target body 3 has S polarity.

The magnetic field generated by the magnetic elements 5 is depicted in FIG. 4 by means of the dashed lines of magnetic field B. The lines of magnetic field B link the poles N, S of the magnetic elements 5 placed side by side. Specifically, the lines of magnetic field B can be curved lines, more specifically of arched form, arranged among the magnetic elements 5.

The lines of magnetic field cross the target body 3 and affect the region of the machine 1 comprised between the target body 3 and the deposition substrate, thus causing an acceleration of the plasma particles contained in said region towards the target body 3. It has to be observed that for the sake of simplicity, in FIG. 4 the lines of magnetic field B possibly linking the points of the inner sides of the magnetic elements 5 facing the tubular support 2 have not been depicted.

Turning to the embodiment of the machine 1 herein described, FIG. 2 shows a section of the machine 1 for the deposition of material, wherein a preferred arrangement is depicted in detail of the magnetic elements 5 along the tubular support 2 having in this case has cylindrical geometry with circular base in accordance with the geometry taken by the respective target body 3 having cylindrical shape with annular base.

The magnetic elements 5 of the embodiment shown in FIG. 2 have substantially cylindrical shape with annular section, with symmetry axis substantially coincident with the axis A of the tubular support 2.

Of course, in the machine 1 of the present invention any other arrangement of the magnetic elements 5 can be used, for example bar-shaped or with oval section or still others, which allows having for each magnetic element 5 a relative outer side jutting from the support 2 having a given magnetic polarity (for example S) and an opposing inner side facing the axis A of the support 2 having the opposite magnetic polarity (for example N), and so that the axis or axes of magnetic orientation M of such magnetic elements 5 is/are transverse to the axis A of the tubular support 2.

In any case, with the machine 1 having the herein described cylindrical geometry, in the respective cathode assembly, cylindrical magnetic elements 5 having annular section and a symmetry axis substantially parallel to the axis A of the tubular support 2 are preferably used, each having an outer side, or lateral surface, of the same magnetic polarity, and an inner side, or lateral surface, of the same, opposite, magnetic polarity and with axis, or axes, of magnetic orientation M transverse to the axis A of the tubular support 2.

Advantageously, in the herein shown implementation, the axis, or the axes, M of magnetic orientation linking the poles N, S of each magnetic element 5 is always substantially radial, and thus perpendicular, with respect to the axis A of the tubular support 2.

Indeed the two, inner and outer, opposing sides of each magnetic element 5 respectively belong to one and the other of the two polarities N, S, and in the particular embodiment of FIG. 2 the axis M linking them is arranged so that to always be radial with respect to the axis A of the cylindrical tubular support 2, i.e. always orthogonal to such an axis A.

It has to be observed that, apparently, in case each magnetic element 5 has cylindrical shape with annular section and is shaped so that to have a (cylindrical) outer side of only one magnetic polarity and an inner side (cylindrical too) of the opposite polarity, then there is an infinity or plurality of axes of magnetic orientation M that are however arranged to form transverse circles with respect to the axis A of the support 2 and, specifically, preferably arranged so that to be radial, i.e. orthogonal, with respect to such an axis A.

Furthermore, preferably one of the two opposing sides of each magnetic element 5, for example the one having the polarity N, can be constrained to the tubular support 2, for example by a frame 7, and the other outer side of the two opposing sides, for example the one having to the polarity S, can be jutting from the tubular support 2.

In the implementation of the herein attached figures, the magnetic elements 5 are suitably spaced from one another on the support 2 at least along one direction parallel to the axis A of the same tubular support 2 and are preferably arranged substantially aligned along an axis parallel to such an axis A of the support 2.

As mentioned, the side jutting from the tubular support 2 of each magnetic element 5, i.e. the so-called outer side, has a polarity N, S alternating with respect to that of the jutting, or outer side, from the tubular support 2 of an adjacent subsequent magnetic element 5, with respect to the direction of the axis A.

For example, a first magnetic element 5 can have an outer side jutting from the tubular support 2 of polarity N (and the corresponding opposing inner side of the same first magnetic element 5 of polarity S), whereas a second magnetic element 5 joining and subsequent to the first magnetic element 5 with respect to the parallel direction of the axis A of the tubular support 2 can have an outer side jutting from the tubular support 2 of polarity S (and the corresponding opposing inner side of the same second magnetic element 5 of polarity N), and so forth for all the magnetic elements of the plurality of magnetic elements 5 of the machine 1.

In practice, the outer sides of the magnetic elements 5 axially adjoining one another and in succession on the tubular support 2, have alternating magnetic pole along the direction defined by the axis A of the same tubular support 2, or however along at least one direction substantially parallel to such an axis A of the support 2.

In case the tubular support 2 is of the type having cylindrical shape, i.e. with a surface substantially defined by an infinity of straight lines (generatrices) parallel one another and passing through the points of a flat closed line (directrix) perpendicularly to the plane of such a closed line, then substantially along each generatrix G of the tubular body 2, the polarity of the outer side of two adjacent magnetic elements 5, along the axis A or along at least one direction substantially parallel to such an axis A, is alternating.

It has to be observed that in this case, and if the inner sides of opposite polarity are constrained to the tubular support 2, such a tubular support 2 can be advantageously made, at least partially, of magnetic or ferromagnetic, or even paramagnetic and however not diamagnetic material, in order to close on the tubular support 2 a branch of the magnetic circuit established among magnetic elements 5 placed, as adjacent and in succession, on the same tubular support 2. As it will be seen, in this regard the tubular support 2 can comprise one frame 7 suitably made of ferromagnetic material (see also FIG. 4) and having the function of constraining such magnetic elements 5 to the same support 2.

Furthermore, according to a particular embodiment of the present invention, the plurality of magnetic elements 5 can have the same distance among the opposing sides of each magnetic element 5, i.e. can have equal thickness. In other words, in case of cylindrical magnetic elements 5 having a substantially annular section, the outer side of each magnetic element 5 surrounds the tubular support 2 at the same distance from the first axis A of the tubular support 2. Or rather each magnetic element 5 has the same radial length, i.e. the same length in the direction substantially perpendicular to the axis A of the tubular support 2.

According to the embodiment shown in FIGS. 1-3, each magnetic element 5 can advantageously have a plurality of magnets arranged side by side around the edge of the tubular support 2, so that to always have the same magnetic polarity, N or S, along the entire outer side of the respective magnetic element 5.

In the embodiment shown in the accompanying figures, as already mentioned, the tubular support 2 can be a substantially cylindrical support, i.e. of the type having an outer surface shaped by drawing, through the points of a flat closed line (directrix), straight lines parallel one another and perpendicular to the plane of the closed line (generatrices), which is possibly provided with a frame 7, and each magnetic element 5 can have a plurality of magnets circularly arranged around a circle with centre located substantially at the axis A of the tubular support 2.

In this case, the magnets of each magnetic element 5 can be bars or prisms substantially rectangular or slightly beveled, so that the side jutting from the tubular support 2 towards the target body 3 is more extended than the side constrained to the tubular support 2. The axis of magnetic orientation of each magnet constituting each of the magnetic elements 5 has a direction substantially radial with respect to the tubular support 2, i.e. a direction substantially perpendicular to the axis A of the tubular support 2, so that the axis of magnetic orientation M of each magnetic element 5 is always substantially radial, i.e. directed orthogonally to the axis A of the support 2.

The magnets constituting each individual magnetic element 5 can preferably define an annular cylindrical outer side and an inner side also annular cylindrical, which have opposed polarities.

The use of a plurality of magnets defining each magnetic element 5, on the one hand allows them to be rapidly replaced in case this is required during the normal maintenance activities, on the other hand allows the diameter of such magnetic elements 5 to be easily increased or reduced, by simply using a frame 7 of increased or reduced diameter and a larger or smaller number of magnets constituting each magnetic element 5.

It has to be observed that such an increase or reduction of the diameter—or however of the outer size—of the magnetic elements can be required in case the sizes of the target body 3 used are modified.

The tubular support 2 of the machine 1 can further comprise, as already mentioned, a frame 7 of ferromagnetic, or magnetic or even paramagnetic material, placed at the inner side of the magnetic elements 5. In other words, the machine 1 comprises a ferromagnetic frame 7 linking and possibly constraining the magnetic elements 5 to the core of the cylindrical support 2. According to a possible embodiment, the magnetic elements 5 can be constrained indeed to such a ferromagnetic frame 7, which in this case can have hollows in which each magnetic element 5 can be inserted—and in case the respective magnets constituting each of such elements 5—and can be made integral to a core, for example having a cylindrical bar shape, of the tubular support 2. Such a ferromagnetic frame 7, arranged among the ferromagnetic elements 5 and the core of the tubular support 2, allows the lines of magnetic field generated by the magnetic elements 5 to be contained by closing part of the respective magnetic circuit, so as to obtain the desired magnetic field.

It has to be observed that the afore described arrangement with substantially ring-shaped (i.e. cylindrical with annular section) magnetic elements 5, or also the disc shape of such magnetic elements 5, specifically allows the magnetization profile to be varied by increasing or reducing the distance between the axes among magnets (or however among the magnetic elements 5), along the afore said development axis A of the tubular support 2, or along at least one direction substantially parallel to such an axis A, in order to optimize the deposition rate of the material and obtain a much higher evenness on the thickness reported on the samples to be deposited.

For the same purpose the thickness of the ferromagnetic material of the support 2 can be modified so that to locally modify the intensity of the magnetic field, notably on the final parts of the cathode itself.

Figure 5:
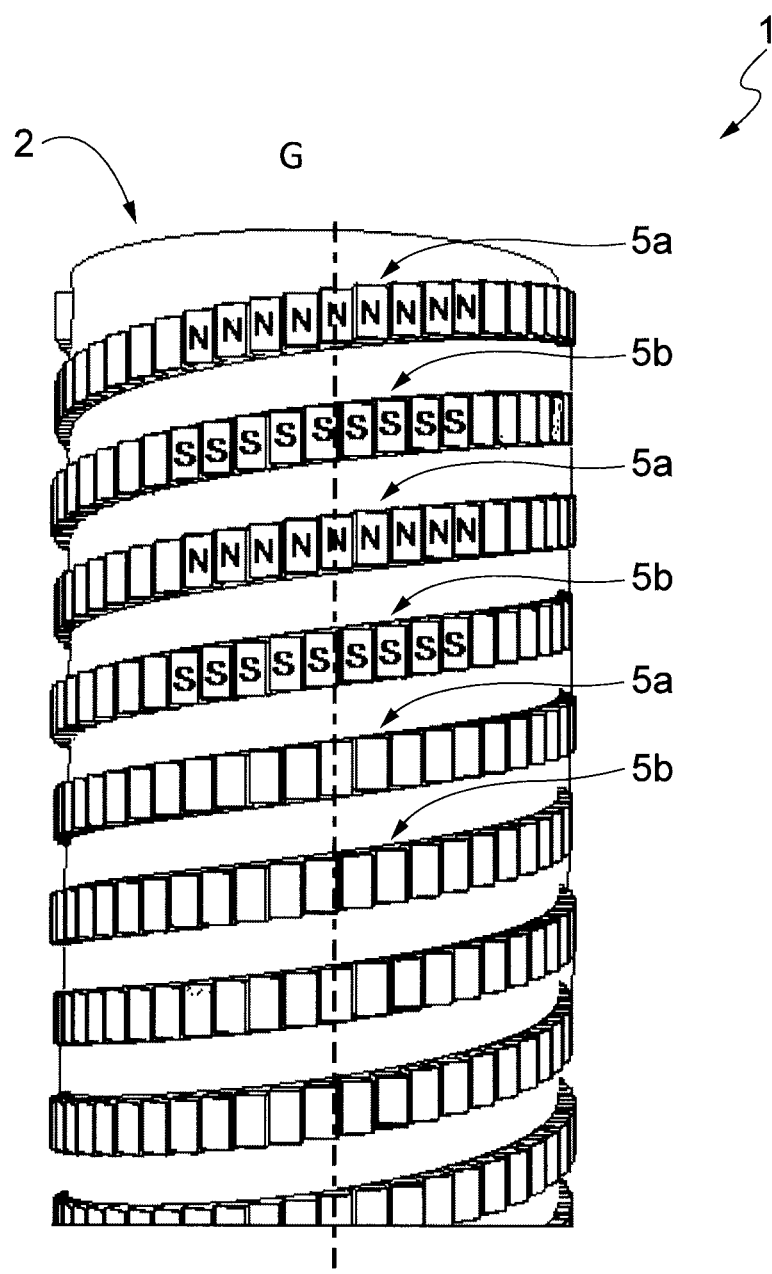
FIG. 5 shows an embodiment of the cathode assembly of the machine for the deposition of material according to the present invention.

FIG. 5 shows an alternative embodiment of the arrangement of the magnetic elements 5 on the tubular support 2. In this embodiment the magnets form parallel helices with orientation of the magnetic field inverted between adjacent helices.

Specifically, according to this possible embodiment, each magnetic element 5A, 5B comprises a plurality of magnets arranged along a helicoid line around the axis A of the tubular support 2.

In practice, the magnetic elements 5A, 5B in this implementation substantially form a double helix spaced along a direction substantially parallel to the axis A of the tubular support 2.

The plurality of magnets arranged along helicoid lines forms a first helicoid magnetic element and a second helicoid magnetic element both alternating along the direction of the axis A of the tubular support 2, or however along at least one direction substantially parallel to such an axis A of the support 2. The magnets belonging to the first magnetic element 5a are arranged so that to have the outer side of the same polarity. In the same way, the magnets belonging to the second magnetic element 5b are arranged so that to have the outer side of the same polarity and opposite polarity with respect to that of the magnets belonging to the first magnetic element 5a.

In this way, the magnets belonging to a magnetic element 5a, 5b constitute all the magnets oriented with the same polarity.

Furthermore, also in this embodiment according to the present invention, the magnetic elements 5a, 5b are alternating and thus the magnets forming the first magnetic element 5a, in other words the magnets oriented according to a first magnetic orientation, are arranged as spaced from one another along at least one direction substantially parallel to the axis A along which the tubular support 2 develops, with respect to the magnets forming the second magnetic element 5b, in other words the magnets oriented according to a second magnetic orientation opposite to the first magnetic orientation.

More in detail, in reference to this particular embodiment, in case of tubular support 2 having cylindrical shape, the outer sides of the magnets constituting the spaced from one another magnetic elements 5a, 5b have alternating polarity along any direction parallel to the axis A of the tubular support 2, i.e. along any of the generatrices of the cylindrical-shaped tubular support 2.

In practice, by considering any one of the generatrices G of the cylindrical-shaped tubular support 2, along the direction defined by such a generatrix G the outer sides of the magnets of two adjacent magnetic elements 5a, 5b have alternating polarity.

As already mentioned, independently from the embodiment of the magnetic elements afore described, the machine 1 can further comprise movement means 8 for the relative movement between the tubular support 2, with said plurality of magnetic elements 5, and the target body 3.

The movement means 8 can allow at least the tubular support 2 and the magnetic elements 5 to be translated along an axis parallel, or coincident to, the axis A of the tubular support 2. In this way, the relative position of the tubular support 2 and magnets 5 can be adapted with respect to the target body 3 and the axially-even erosion of the target body 3 itself can be further allowed. The relative movement among the magnetic elements 5 and the target body 3 can indeed allow the erosion level of the surface of such a target body 3 to be controlled, thanks to the relative displacement of the static magnetic fields (obviously having intensity variable over space) defined by the magnetic elements 5 with respect to the target body 3 itself.

The movement means 8 can be known movement means, such as for example mechanical, pneumatic or hydraulic movement means.

The control of the movement means 8 can be a control of manual type, such as for example operable by a specialized operator, or automatic, such as for example driven by a control unit able to determine parameters useful for the evenness of erosion of the target body 3, such as stopping and movement times of the tubular support 2 with the respective magnetic elements 5, the speed and the direction of the translation of the tubular support 2 with the magnetic elements 5 with respect to the target body 3.

In case the cathodic component of the afore described machine 1 provides the use of magnetic elements 5 having an outer side substantially annular and the target body 3 has cylindrical geometry, in order to obtain an even erosion of the target body 3 itself it has proven to be adequate that such movement means 8 allow the tubular support 2 to be translated, with the respective magnetic elements 5, exclusively with respect to the target body 3, or vice versa.

According to an embodiment of the movement means 8 combined with the machine 1, in which the magnetic elements comprise a plurality of magnets arranged along a helicoid line, such movement means 8 can comprise means for rotating the tubular support 2, which comprises the magnetic elements 5a, 5b, or directly means for rotating the magnetic elements 5a, 5b with respect to the tubular support 2.

According to an additional aspect of the present invention, the machine 1 can comprise cooling means for cooling the components of the machine 1 itself which are subjected to the heating due to the cathodic sputtering procedure that causes the erosion of the surface of the target body 3.

Specifically, the machine 1 can comprise a supply system for supplying water, or another heat exchange fluid, flowing at least inside said tubular support 2 through an inlet 9a and an outlet 9b. The water entering the machine 1 is filled at a temperature lower than the temperature of the elements of the machine 1 requiring cooling.

Once the water has been introduced through the inlet 9a, it flows through passages that allow the water to be in thermal contact with the hot elements of the machine 1. In this way, heat exchange is made possible among the hot elements, such as for example the target body 3 or the elements thermally contacting the target body 3, and the elements having lower temperature such as for example the water introduced into the machine.

Once the water flowed through the inner ducts of the machine 1 and the heat exchange occurred between the hot bodies of the machine 1 and the water, the latter can be caused to flow through an outlet duct ending with an outlet 9b for discharging water.

As it is adequate in the machine 1 herein shown, it has to be observed that in case the movement means 8 are of the type able to relatively translate the tubular support 2 only with respect to the target body 3, the hydraulic inflow and outflow circuit of the cooling water is indeed simplified.

By means preferably of the machine 1 herein above described, the following method can be implemented for the deposition of material by cathodic magnetron sputtering, comprising the steps of:

a) prearranging inside a low pressure chamber (for example with pressure of some Pa or some tens of mTorr) filled with a preferably inert gas (for example argon) the target body 3 around, or at the tubular support 2 with the respective magnetic elements 5, at a proper distance from the latter;

b) prearranging the substrate, to be coated inside said low pressure chamber, frontally with respect to the outer lateral surface of the target body 2;

c) establishing an appropriate potential difference between the target body 3 and the substrate to be coated (for example some kV) and causing the plasma to be formed;

d) actuating the cooling means 9 for cooling the target body and the cathode assembly;

e) actuating the movement means 8 to move the tubular support 2 at least in translation with respect to the target body 3 along an axis parallel or coincident to said axis A of the tubular support 2.

The invention claimed is:

1. A machine for the deposition of material on a substrate by the cathodic sputtering technique, of the type provided with a cathode assembly comprising:

a tubular support extending substantially along a first axis (A);

a plurality of magnetic elements constrained to said tubular support and spaced from one another at least along said first axis (A), or along a direction substantially parallel to said first axis (A), and wherein each of said magnetic elements has a second axis (M), of magnetic orientation, linking the respective magnetic poles (N; S) and comprises an outer side jutting from the tubular support and an inner side facing the axis (A) of said tubular support;

a target body having substantially cylindrical shape and being arranged spaced around said cylindrical support with said plurality of magnetic elements and comprising said material to be deposited on the substrate, said outer side of each magnetic element facing said target body;

movement means for the relative movement between said tubular support, with said plurality of magnetic elements, and said target body;

wherein said second axis (M) linking the poles of each magnetic element is transverse to said first axis (A) of the tubular support and in that the polarity (S; N) of the outer sides of two consecutive magnetic elements along said first axis (A), or along a direction substantially parallel to said first axis (A), on said tubular support is alternating, and wherein each of said magnetic elements comprises a plurality of magnets arranged along a helicoid line around said first axis (A) of said tubular support and said tubular support is at least partially made of a magnetic or ferromagnetic material.

2. The machine according to claim 1, wherein the outer side of each magnetic element has the same polarity (S or N) along its entire extent.

3. The machine according to claim 1, wherein each of said magnetic elements has an annular or discoid section with symmetry axis substantially parallel to said first axis (A) of said tubular support and with said second axis (M) of magnetic orientation substantially radial and orthogonal with respect to said first axis (A).

4. The machine according to claim 1, wherein said tubular body has a substantially cylindrical shape, wherein substantially along each generatrix (G) of said tubular body the polarity of the outer side of two adjacent magnetic elements is alternating.

5. The machine according to claim 1, wherein the outer side of each magnetic element surrounds said tubular support at the same distance from said first axis (A) of said tubular support.

6. The machine according to claim 1, wherein each magnetic element comprises a plurality of magnets having radial axis of magnetic orientation.

7. The machine according to claim 1, wherein said tubular support comprises a frame of ferromagnetic material facing said inner side of the magnetic elements.

8. The machine according to claim 1, wherein said inner side of each of said magnetic elements is constrained to said tubular support.

9. The machine according to claim 1, wherein said movement means allow at least said tubular support to be translated along an axis parallel or coincident with said first axis (A) with respect to said target body.

10. The machine according to claim 1, comprising cooling means for cooling at least said target body.

11. The machine according to claim 10, wherein said cooling means comprise a supply system for supplying water flowing at least inside said tubular support through an inlet and an outlet.

12. The machine according to claim 1, wherein said tubular support is a cylindrical support and each of said magnetic elements has cylindrical shape with annular section.

13. The machine according to claim 1, wherein said tubular support includes a central core and a ferromagnetic frame, wherein said magnetic elements are constrained to said central core by said frame.

14. The machine according to claim 13, wherein said ferromagnetic frame has hollows in which each of said magnetic elements is received.

15. The machine according to claim 13, wherein said ferromagnetic frame is replaceable on said central core, whereby frames of different diameters can be constrained to the central core.

* * * * *